United States Patent [19]

Haga et al.

[11] Patent Number: 4,902,907

[45] Date of Patent: Feb. 20, 1990

[54] RESET SIGNAL GENERATING CIRCUIT

[75] Inventors: Akira Haga, Kawasaki; Kazuhiro Kobayashi, Yokohama, both of Japan

[73] Assignee: Fujitsu Limited, Kawasaki, Japan

[21] Appl. No.: 271,818

[22] Filed: Nov. 16, 1988

[30] Foreign Application Priority Data

Nov. 18, 1987 [JP] Japan .................. 62-291217

[51] Int. Cl.⁴ ............... H03K 17/20; H03K 17/22; H03K 5/153; H03K 17/687
[52] U.S. Cl. .................. 307/272.3; 307/594; 307/296.5
[58] Field of Search ........... 307/272.3, 592, 594, 307/597, 296 R, 297, 296.4, 296.5, 603, 200 B

[56] References Cited

U.S. PATENT DOCUMENTS

| | | | |
|---|---|---|---|
| 4,013,902 | 3/1977 | Payne | 307/594 |
| 4,140,930 | 2/1979 | Tanaka | 307/594 X |
| 4,581,552 | 4/1986 | Womack et al. | 307/594 |
| 4,634,904 | 1/1987 | Wong | 307/594 |
| 4,716,322 | 12/1987 | D'Arrigo et al. | 307/594 X |
| 4,717,840 | 1/1988 | Ouyang et al. | 307/594 |
| 4,812,679 | 3/1989 | Mahabadi | 307/594 X |

FOREIGN PATENT DOCUMENTS 61-288516 12/1986 Japan .

Primary Examiner—Stanley D. Miller
Assistant Examiner—David R. Bertelson
Attorney, Agent, or Firm—Armstrong, Nikaido, Marmelstein, Kubovcik & Murray

[57] ABSTRACT

A reset signal generating circuit has a voltage dividing circuit for dividing a power source voltage into a divided voltage, a first switching part controlled responsive to the divided voltage from the voltage dividing circuit and turned ON when the power source voltage rises to a value in a vicinity of a predetermined value with an arbitrary rising speed, a second switching part controlled responsive to an output signal of the first switching part and turned ON during a time in which the first switching part is ON, and a charging and discharging part including a capacitor supplied with an output signal of the second switching part for starting a charging operation from a first time when the second switching part turns ON. The charging and discharging part outputs a reset signal for a constant time from the first time to a second time and stops to output the reset signal after the second time.

10 Claims, 6 Drawing Sheets

FIG. 1
PRIOR ART
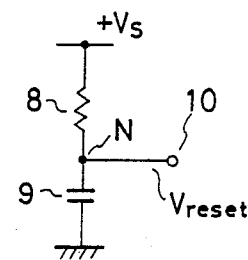
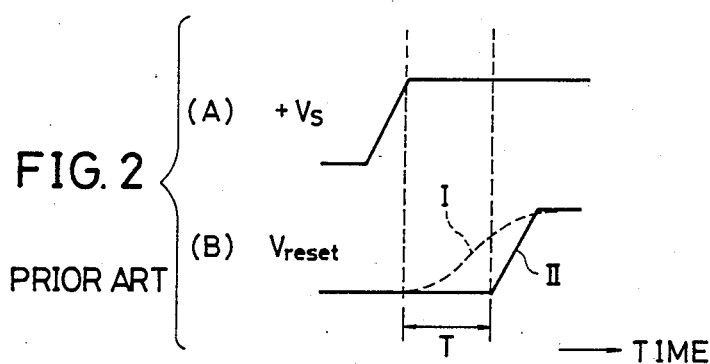
FIG. 2 PRIOR ART
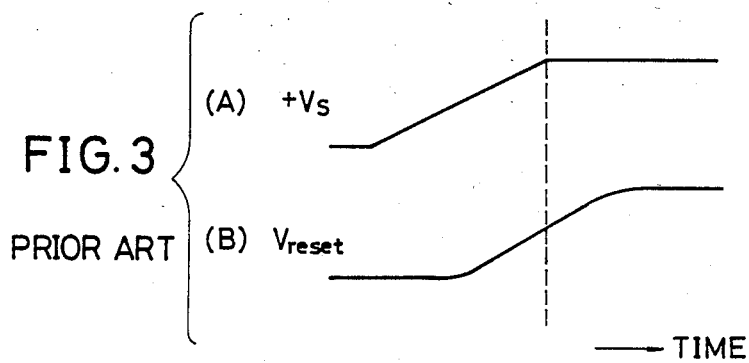
FIG. 3 PRIOR ART

RESET SIGNAL GENERATING CIRCUIT

BACKGROUND OF THE INVENTION

The present invention generally relates to reset signal generating circuits, and more particularly to a reset signal generating circuit which generates a reset signal for resetting an internal logic circuit of a semiconductor device to an initial state when a power source is turned ON.

An internal circuit of a semiconductor device is reset after a power source is turned ON when applied with a power source voltage over a predetermined value, and starts an operation when the reset signal is cancelled. It is essential that such an internal circuit is applied with the reset signal for resetting the internal circuit to an initial state immediately after the power source is turned ON. For this reason, it is important that a reset signal generating circuit for generating the reset signal generates the required reset signal regardless of a speed with which the output power source voltage of the power source rises to the predetermined value.

FIG. 1 shows an example of a conventional reset signal generating circuit. The conventional reset signal generating circuit has a resistor 8 and a capacitor 9 connected in series between a power source voltage +Vs and the ground, and a reset signal is outputted from an output terminal 10 immediately after the power source is turned ON. The output terminal 10 connects to a node N between the resistor 8 and the capacitor 9.

When the power source is turned ON, the power source voltage +Vs rises toward a predetermined value. A speed with which the output power source voltage +Vs rises to the predetermined value will hereinafter be referred to as a rising speed. In a case where the rising speed is high, a terminal voltage (that is, the output reset signal) Vreset of the capacitor 9 rises with a charging time constant of the capacitor 9 as indicated by a phantom line I in FIG. 2(B) after the power source voltage +Vs shown in FIG. 2(A) reaches the predetermined value.

An internal circuit (not shown) connected to the output terminal 10 discriminates a low level when the voltage from the output terminal 10 is less than or equal to a predetermined threshold value and discriminates a high level when the voltage from the output terminal 10 is greater than the predetermined threshold value. Hence, when viewed from the side of the internal circuit, a binary signal indicated by a solid line II in FIG. 2(B) is obtained from the output terminal 10.

In a state where the power source voltage +Vs has reached the predetermined value, the voltage Vreset from the output terminal 10, that is, the input voltage Vreset of the internal circuit, indicates the reset signal when a logic level thereof is low and indicates a reset signal output prohibit state when the logic level thereof is high. In other words, the low level of the reset signal is active. Accordingly, in the conventional reset signal generating circuit, the reset signal is outputted normally during a time T shown in FIG. 2(B) when the rising speed of the power source voltage +Vs is high.

However, in a case where the rising speed of the power source voltage +Vs is low and it takes a long time for the power source voltage +Vs to reach the predetermined value from the time when the power source is turned ON as shown in FIG. 3(A), the charging of the capacitor 9 progresses by the time the power source voltage +Vs having the predetermined value is applied to the internal circuit. By the time the power source voltage +Vs reaches the predetermined value, the terminal voltage (that is, the output reset signal) Vreset of the capacitor 9 is either slightly greater than or slightly less than the threshold value of the internal circuit. Therefore, there are problems in that no low-level reset signal is outputted from the reset signal generating circuit in the former case shown in FIG. 3(B), and a time in which the low-level reset signal is generated is extremely short in the latter case.

Accordingly, in a semiconductor device having the conventional reset signal generating circuit for automatically resetting an internal circuit of the semiconductor device, it is essential that the power source voltage +Vs outputted from the power source rises to the predetermined value within a time which guarantees the generation of the active reset signal for a sufficiently long time to positively reset the internal circuit. Otherwise, it is necessary to generate an external reset signal and apply the reset signal to the internal circuit of the semiconductor device, but the use of such an external reset signal requires on the semiconductor device a terminal exclusively for receiving the external reset signal.

On the other hand, a reset signal generating circuit which generates an active reset signal only after the power source voltage +Vs reaches a reference voltage is disclosed in a Japanese Laid-Open Patent Application No. 61-288516. However, when there is a change in the power source voltage +Vs for some reason and the power source voltage +Vs ceases for a certain time, for example, there is a problem in that no active reset signal is generated when the power source voltage +Vs next rises to the reference voltage. In other words, no resetting of the internal circuit takes place even though the power source voltage +Vs once ceases.

SUMMARY OF THE INVENTION

Accordingly, it is a general object of the present invention to provide a novel and useful reset signal generating circuit in which the problems described above are eliminated.

Another and more specific object of the present invention is to provide a reset signal generating circuit which generates a reset signal regardless of a rising speed with which an output power source voltage of a power source rises to a predetermined value.

Still another object of the present invention is to provide a reset signal generating circuit having a voltage dividing circuit for dividing a power source voltage into a divided voltage, a first switching part controlled responsive to the divided voltage from the voltage dividing circuit and turned ON when the power source voltage rises to a value in a vicinity of a predetermined value with an arbitrary rising speed, a second switching part controlled responsive to an output signal of the first switching part and turned ON during a time in which the first switching part is ON, and a charging and discharging part including a capacitor supplied with an output signal of the second switching part for starting a charging operation from a first time when the second switching part turns ON. The charging and discharging part outputs a reset signal for a constant time from the first time to a second time and stops to output the reset signal after the second time. According to the reset signal generating circuit of the present invention, it is possible to positively generate the reset signal regardless of the rising speed with which the power source voltage rises to the predetermined value and even when a change occurs in the power source voltage and the power source voltage ceases for some reason.

Other objects and further features of the present invention will be apparent from the following detailed description when read in conjunction with the accompanying drawings.

BRIEF DESCRIPTION OF THE DRAWINGS

FIG. 1 is a circuit diagram showing an example of a conventional reset signal generating circuit;

FIGS. 2(A) and 2(B) are timing charts for explaining an operation of the conventional reset signal generating circuit when a rising speed of a power source voltage is high;

FIGS. 3(A) and 3(B) are timing charts for explaining an operation of the conventional reset signal generating circuit when the rising speed of the power source voltage is low;

DETAILED DESCRIPTION

Figure 4:
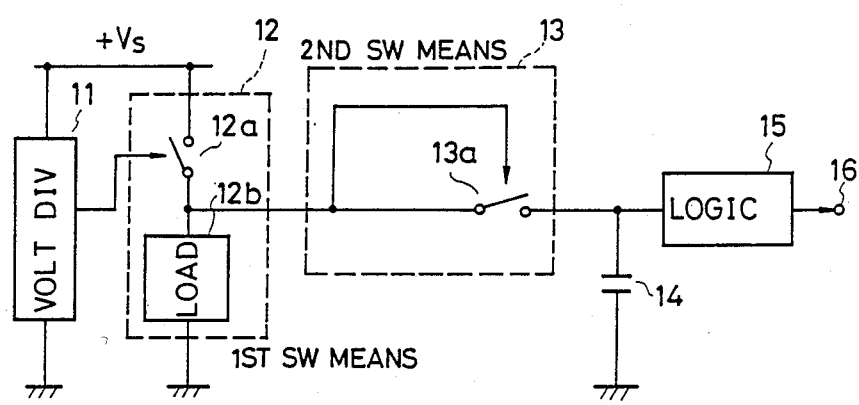
FIG. 4 is a system block diagram showing a reset signal generating circuit according to the present invention for explaining an operating principle thereof.

FIG. 4 shows a reset signal generating circuit according to the present invention for explaining an operating principle thereof. The reset signal generating circuit has a voltage dividing circuit 11 for dividing a power source voltage +Vs, a first switching means 12, a second switching means 13, a capacitor 14, and a logic circuit 15. The first switching means 12 has a switch 12a and a load 12b connected in series between the power source voltage +Vs and the ground. The second switching means 13 has a switch 13a. The first switching means 12 is controlled by an output voltage of the voltage dividing circuit 11, and the second switching means 13 is turned ON by an output signal of the first switching means 12 during a time in which the first switching means 12 is ON. The capacitor 14 starts a charging operation when the second switching means 13 turns ON. A reset signal is outputted from an output terminal 16.

After the power source is turned ON, the first switching means 12 is turned ON by the output voltage of the voltage dividing circuit 11 when the power source voltage +Vs reaches a voltage in a vicinity of a predetermined value. The second switching means 13 turns ON to start the charging operation of the capacitor 14 when the first switching means 12 turns ON. A terminal voltage of the capacitor 14 increases by the charging operation, and the logic circuit 15 outputs a low-level reset signal to the output terminal 16 during a predetermined time until the terminal voltage exceeds a threshold value of the logic circuit 15. The logic circuit 15 stops outputting the low-level reset signal after the predetermined time elapses. Therefore, the outputting of the reset signal starts after the power source voltage +Vs reaches a predetermined value, and the reset signal is always outputted continuously for the predetermined time.

In FIG. 4, it is not essential that the logic circuit 15 is provided, and the present invention is complete without the logic circuit 15.

Figure 5:
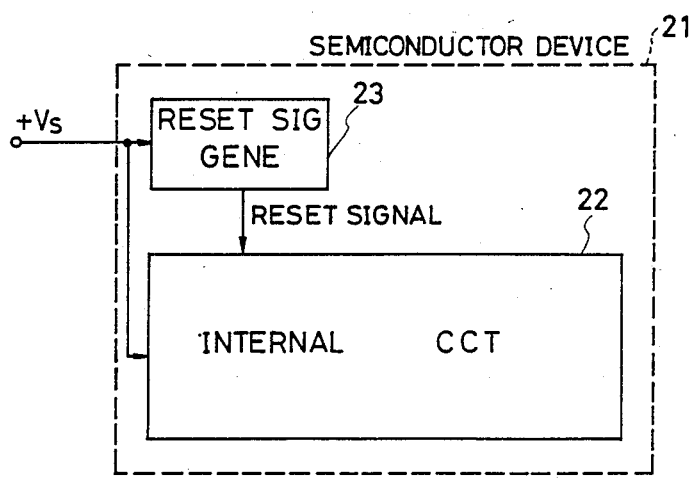
FIG. 5 is a system block diagram showing a semiconductor device applied with the reset signal generating circuit according to the present invention.

FIG. 5 shows a semiconductor device applied with the reset signal generating circuit according to the present invention. A semiconductor device 21 has an internal circuit 22 and a reset circuit 23. The internal circuit 21 is supplied with the power source voltage +Vs, and the reset signal from the reset signal generating circuit 23.

Figure 6:
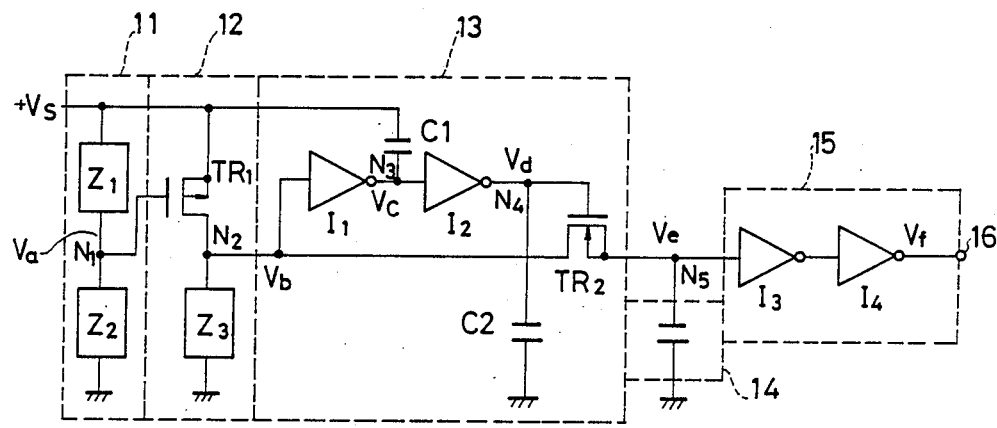
FIG. 6 is a circuit diagram showing an embodiment of the reset signal generating circuit according to the present invention.

FIG. 6 shows an embodiment of the reset signal generating circuit according to the present invention. In FIG. 6, those parts which are the same as those corresponding parts in FIG. 4 are designated by the same reference numerals. In FIG. 6, the voltage dividing circuit 11 has impedance elements Z1 and Z2, while the first switching means 12 has a p-channel metal oxide semiconductor field effect transistor (MOSFET) TR1 and an impedance element Z3 which acts as the load 12b. A node N1 between the impedance elements Z1 and Z2 is connected to a gate of the MOSFET TR1. The second switching means 13 has inverters I1 and I2, capacitors C1 and C2, and an n-channel MOSFET TR2 which are connected as shown. The logic circuit 15 has series connected inverters I3 and I4.

Figure 7:
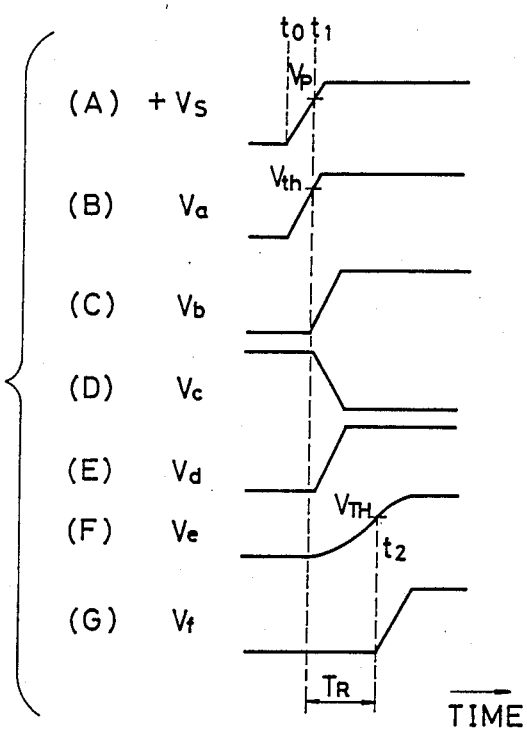
FIGS. 7(A) through 7(G) are timing charts for explaining an operation of the reset signal generating circuit shown in FIG. 6 when a rising speed of a power source voltage is high.

Next, a description will be given of the operation of this embodiment when the rising speed of the power source is high after the power source is turned ON at a time t0. In this case, the power source voltage +Vs reaches a predetermined value Vp within a short time as shown in FIG. 7(A). Hence, a divided voltage Va at the node N1 also rises within a short time. At a time immediately after the power source is turned ON when the power source voltage +Vs has not reached the predetermined value, the voltage Va has a low level as shown in FIG. 7(B) and the MOSFET TR1 is OFF. Hence, the level of a voltage Vb at a node N2 between a drain of the MOSFET TR1 and the impedance element Z3 is also low as shown in FIG. 7(C). Consequently, the level of a voltage Vc at a node N3 on an output side of the inverter I1 is high as shown in FIG. 7(D), the level of a voltage Vd at a node N4 on an output side of the inverter I2 is low as shown in FIG. 7(E), and the MOSFET TR2 is OFF. The level of a voltage Ve at a node N5, that is, the terminal voltage of the capacitor 14 supplied to the inverter I3, is low as shown in FIG. 7(F). In addition, the level of a voltage Vf which is outputted from the inverter I4 is low as shown in FIG. 7(G).

Thereafter, when the power source voltage +Vs reaches the predetermined value Vp at a time t1 which is a short time after the time t0 when the power source is turned ON, the divided voltage Va exceeds a threshold value Vth of the MOSFET TR1 and turns the MOSFET TR1 ON. Thus, a current flows through the MOSFET TR1 and the impedance element Z3, and the level of the voltage Vb becomes high. The value of the divided voltage Va is adjusted depending on a ratio of the impedances of the impedance elements Z1 and Z2.

Accordingly, the capacitor C1 is charged by the output voltage Vc of the inverter I1 to make the level of the voltage Vc low and the level of the output voltage Vd of the inverter I2 high. When the level of the voltage Vd becomes high, the charging of the capacitor C2 starts and the MOSFET TR2 turns ON. As a result, the voltage Vb having the high level is passed through the drain and source of the MOSFET TR2 and is applied to the capacitor 14 to start charging the capacitor 14.

When the charging of the capacitor 14 starts, the terminal voltage Ve of the capacitor 14 gradually increases with a predetermined charging time constant. But because the inverter I3 discriminates an input voltage thereof as having the low level when the terminal voltage Ve of the capacitor 14 is less than a threshold value $V_{TH}$ and as having the high level when the terminal voltage Ve is greater than or equal to the threshold value $V_{TH}$, the input voltage Ve of the inverter I3 has the low level as shown in FIG. 7(F) until a time t2 when the terminal voltage of the capacitor 14 reaches the threshold value, and has the high level only after the time t2. The inverter I4 inverts an output voltage of the inverter I3. Hence, the output voltage Vf of the inverter I4 rises to the high level at the time t2 as shown in FIG. 7(G).

A time period $T_R$ between the times t1 and t2 is constant. In addition, during this time period $T_R$, the voltage Vf has the low level when the power source voltage +Vs reaches the predetermined value Vp. Therefore, the active reset signal is outputted from the output terminal 16 during this time period $T_R$. The time period (reset interval) $T_R$ is determined by the size of the MOSFETs TR1 and TR2 and the capacitance of the capacitor 14.

Figure 8:
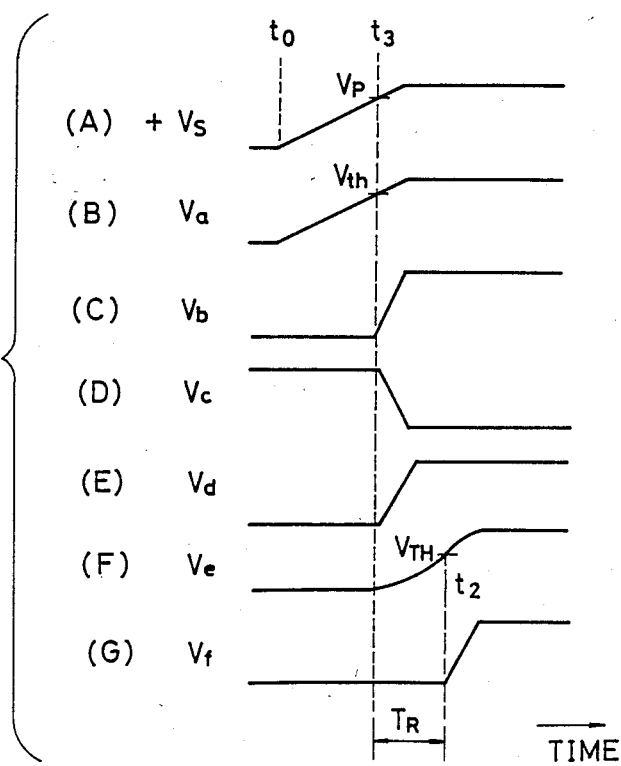
FIGS. 8(A) through 8(G) are timing charts for explaining an operation of the reset signal generating circuit shown in FIG. 6 when the rising speed of the power source voltage is low.

Next, a description will be given of the operation of this embodiment when the rising speed of the power source is low after the power source is turned ON at the time t0. In this case, it takes time until the power source voltage +Vs reaches a voltage in a vicinity of the predetermined value Vp as shown in FIG. 8(A). Hence, it takes time for the divided voltage Va at the node N1 to reach a value in a vicinity of the threshold value Vth as shown in FIG. 8(B). At a time t3 when the divided voltage Va reaches a value lower than the power source voltage +Vs by the threshold value Vth of the MOSFET TR1, the MOSFET TR1 turns ON and the level of the voltage Vb becomes high as shown in FIG. 8(C).

When the level of the voltage Vb becomes high, the level of the voltage Vc becomes low as shown in FIG. 8(D), the level of the voltage Vd becomes high as shown in FIG. 8(E), the MOSFET TR2 turns ON and the terminal voltage Ve of the capacitor 14 remains at the low level until the time t2 when the terminal voltage Ve reaches the threshold voltage $V_{TH}$ of the inverter I3, similarly as in the case where the rising speed of the power source is high. Hence, the capacitor 14 is charged for the constant time period $T_R$, and the low-level voltage Vf shown in FIG. 8(G) is outputted to the output terminal 16 as the active reset signal.

Therefore, according to this embodiment, the capacitor 14 is charged for a constant time (time period $T_R$) after the divided voltage Va reaches the predetermined value Vp. For this reason, it is possible to always output the active reset signal for the constant time regardless of the rising speed of the power source voltage +Vs.

The MOSFET TR2 is used to limit the current when charging the capacitor 14. When a large time constant is required but there is a limit to increasing an area occupied by the capacitor C3 in order to increase the capacitance thereof, for example, it is possible to reduce the size of the MOSFET TR2 and limit the current during the charging operation, thereby obtaining effects equivalent to increasing the capacitance of the capacitor 14.

Figure 9:
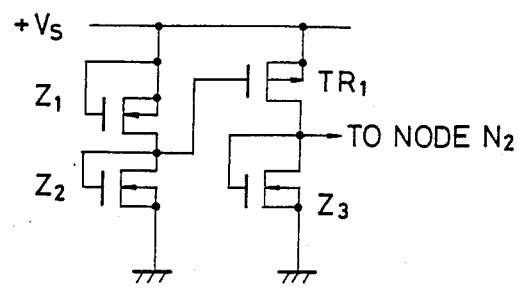
FIGS. 9 through 11 are circuit diagrams respectively showing embodiments of impedance elements of the reset signal generating circuit shown in FIG 6.
Figure 10:
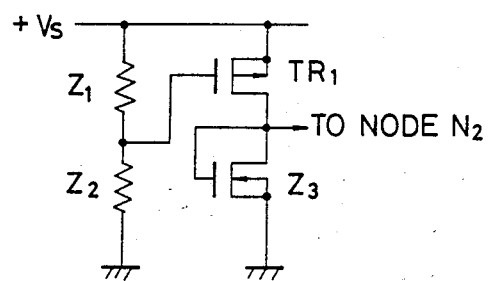
Figure 11:
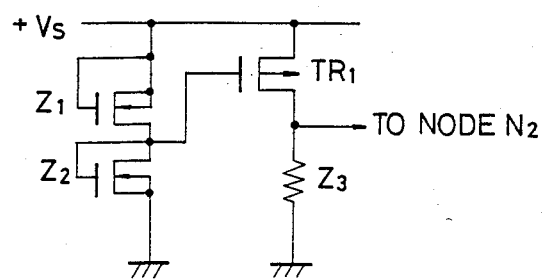

FIGS. 9, 10 and 11 show embodiments of the impedance elements Z1, Z2 and Z3 of the reset signal generating circuit shown in FIG. 6. In FIGS. 9 through 11, those parts which are the same as those corresponding parts in FIG. 6 are designated by the same reference numerals. In FIG. 9, the impedance elements Z1 through Z3 are constituted by n-channel MOSFETs which are connected as shown. In FIG. 10, the impedance elements Z1 and Z2 are constituted by resistors and the impedance element Z3 is constituted by an n-channel MOSFET. In FIG. 11, the impedance elements Z1 and Z2 are constituted by n-channel MOSFETs and the impedance element Z3 is constituted by a resistor.

The impedance elements Z1 through Z3 are not limited to those shown in FIGS. 9 through 11, and for example, other combinations of resistors and transistors are possible.

Figure 12:
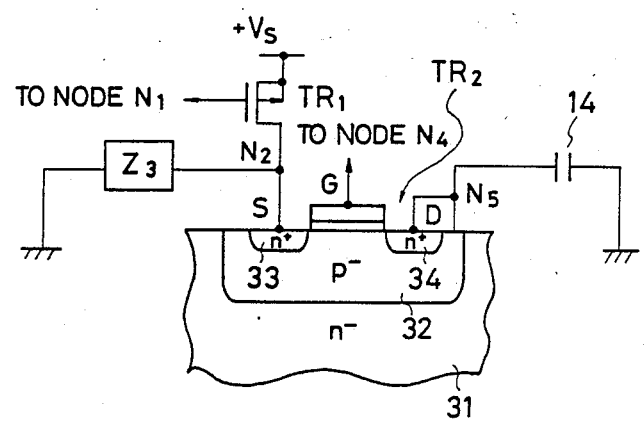
FIG. 12 is a diagram showing an essential part of the reset signal generating circuit shown in FIG. 6 for explaining a discharge of a capacitor of the reset signal generating circuit.

FIG. 12 shows the MOSFET TR2 in a cross section together with an essential part of the reset signal generating circuit shown in FIG. 6 for explaining a discharge of the capacitor 14 through a semiconductor substrate of the MOSFET TR2. In FIG. 12, those parts which are the same as those corresponding parts in FIG. 6 are designed by the same reference numerals. FIGS. 13(A) through 13(G) are timing charts for explaining the discharge of the capacitor 14.

Figure 13:
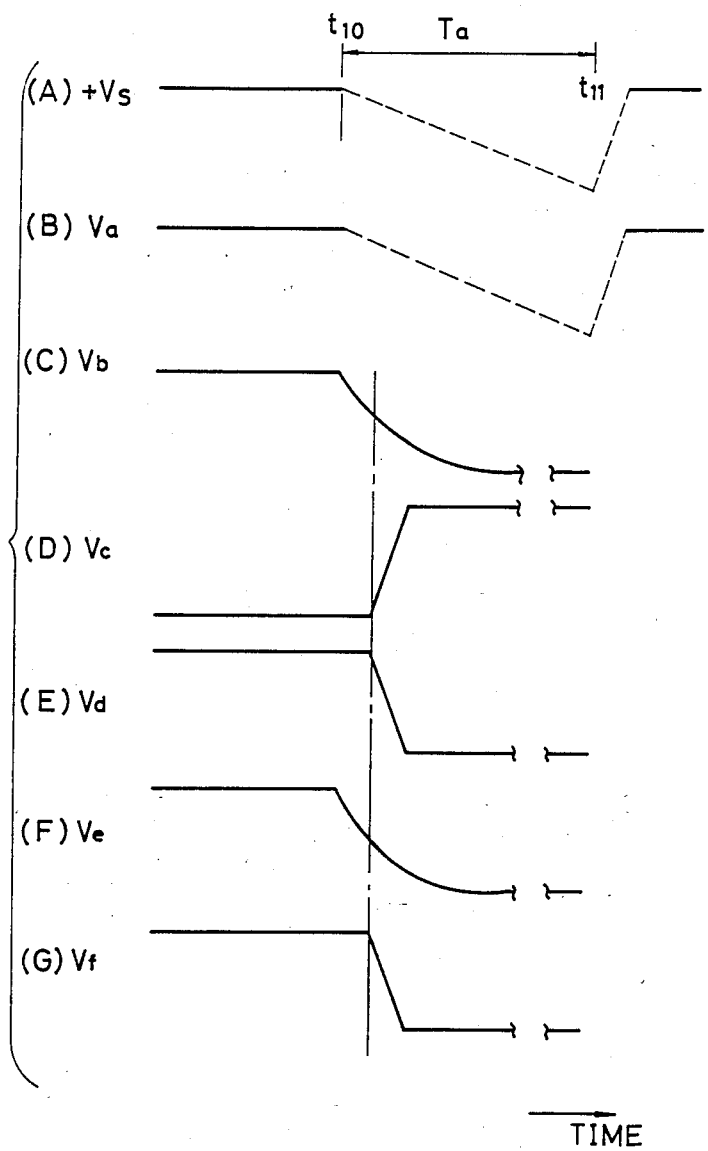
FIGS. 13(A) through 13(G) are timing charts for explaining the discharge of the capacitor of the reset signal generating circuit shown in FIG. 6.

In FIG. 12, the MOSFET TR2 has an n⁻-type semiconductor substrate 31, a p⁻-type region 32, and n⁺-type source and drain regions 33 and 34. The source, drain and gate of the MOSFET TR2 are respectively denoted by S, D and G. When the power source is turned OFF at a time t10 for a time period Ta for some reason, the power source voltage +Vs falls as shown in FIG. 13 (A) and the voltages Va, Vb, Vc, Vd, Ve and Vf respectively change as shown in FIGS. 13(B), 13(C), 13(D), 13(E), 13(F) and 13(G). In this case, the charge in the capacitor 14 is discharged to the ground through the pn junction of the p⁻-type region 32 and the n⁺-type source region 33 and the impedance element Z3. Hence, when the power source voltage +Vs thereafter starts to rise from a time t11 and reaches the predetermined value Vp at a certain time, the active reset signal is positively generated for the time period $T_R$ which is constant. In other words, after the time t11, the generation of the active reset signal is guaranteed after the power source voltage +Vs reaches the predetermined value Vp, regardless of the rising speed of the power source voltage +Vs and even when a change occurs in the power source voltage +Vs and the power souce voltage +Vs ceases for some reason.

Further, the present invention is not limited to these embodiments, but various variations and modifications may be made without departing from the scope of the present invention.

What is claimed is:

1. A reset signal generating circuit comprising:
   voltage dividing means for dividing a power source voltage into a divided voltage;
   first switching means coupled to said voltage dividing means, said first switching means being turned ON when the power source voltage rises to a value in a vicinity of a predetermined value with an arbitrary rising speed;
   second switching means coupled to an output of said first switching means, said second switching means having a transistor which has an input electrode for receiving an output signal of said first switching means, an output electrode and a control electrode, and control means coupled between said input electrode and said control electrode for turning said transistor ON in response to an output signal of said first switching means, said transistor being turned ON during a time in which said first switching means is ON; and
   charging and discharging means coupled to said output electrode of said second switching means having a capacitor which is supplied with an output signal of said second switching means for starting a charging operation from a first time when said second switching means turns ON, said capacitor being charged by a current which flows through said transistor of said second switching means during a charging operation, said charging and discharging means for outputting a reset signal for a constant time from said first time to a second time and for stopping to output a reset signal after said second time.

2. A reset signal generating circuit as claimed in claim 1 wherein said first switching means includes a switch supplied with the power source voltage and a load coupled between said switch and a ground voltage, said switch outputting the power source voltage as the output signal of said first switching means when said first switching means is turned ON.

3. A reset signal generating circuit as claimed in claim 1, wherein said transistor of said second switching means outputs said output signal of said first switching means when said first switching means is turned ON.

4. A reset signal generating circuit as claimed in claim 1, wherein said transistor of said second switching means includes a metal oxide semiconductor (MOS) transistor having a source supplied with said output signal of said first switching means, said control means of said second switching means further having a first inverter supplied with said output signal of said first switching means, a first capacitor having one terminal supplied with the power source voltage and another terminal coupled to an output terminal of said first inverter, a second inverter supplied with an output signal of said first inverter, and a second capacitor having one terminal coupled to an output terminal of said second inverter and another terminal coupled to a ground, said output terminal of said second inverter being coupled to a gate of said MOS transistor, said output signal of said second switching means being obtained from a drain of said MOS transistor.

5. A reset signal generating circuit as claimed in claim 4, wherein said charging and discharging means starts a discharging operation when said power source voltage falls under a certain value after said second time, said first switching means including a switch supplied with the power source voltage and a load coupled between said switch and the ground, said switch outputting the power source voltage as the output signal of said first switching means when said first switching means is turned ON, said discharge operation being a discharge of said capacitor to the ground through a pn junction of said MOS transistor and said load.

6. A reset signal generating circuit as claimed in claim 1 wherein said charging and discharging means further includes a logic circuit which outputs the reset signal after carrying out a logic operation on an output signal of said capacitor.

7. A reset signal generating circuit as claimed in claim 6, wherein said charging and discharging means continues to output the reset signal until a terminal voltage of said capacitor reaches a threshold value of said logic circuit.

8. A reset signal generating circuit as claimed in claim 1, wherein said circuit is provided within a semiconductor device which comprises an internal circuit, said reset signal being supplied to the internal circuit.

9. A reset signal generating circuit comprising:
   voltage dividing means for dividing a power source voltage into a divided voltage;
   first switching means coupled to said voltage dividing means, said first switching means being turned ON when the power source voltage rises to a value in a vicinity of a predetermined value with an arbitrary rising speed;
   second switching means coupled to an output of said first switching means, said second switching means being turned ON during a time in which said first switching means is ON; and
   charging and discharging means including a capacitor which is supplied with an output signal of said second switching means for starting a charging operation from a first time when said second switching means turns ON, said charging and discharging means outputting a reset signal for a constant time from said first time to a second time and stopping to output the reset signal after said second time,
   said second switching means including a metal oxide semiconductor (MOS) transistor having a source supplied with the output signal of said first switching means, a first inverter supplied with the output signal of said first switching means, a first capacitor having one terminal supplied with the power source voltage and another terminal coupled to an output terminal of said first inverter, a second inverter supplied with an output signal of said first inverter, and a second capacitor having one terminal coupled to an output terminal of said second inverter and another terminal coupled to a ground, said output terminal of said second inverter being coupled to a gate of said MOS transistor, said output signal of said second switching means being obtained from a drain of said MOS transistor.

10. A reset signal generating circuit as claimed in claim 9, wherein said charging and discharging means starts a discharging operation when the power source voltage falls under a certain value after said second time, said first switching means including a switch supplied with the power source voltage and a load coupled between said switch and the ground, said switch outputting the power source voltage as the output signal of said first switching means when said first switching means is turned ON, said discharge operation being a discharge of said capacitor to the ground through a pn junction of said MOS transistor and said load.

* * * * *